(12) United States Patent
Moroz et al.

(10) Patent No.: US 9,547,740 B2
(45) Date of Patent: Jan. 17, 2017

(54) METHODS FOR FABRICATING HIGH-DENSITY INTEGRATED CIRCUIT DEVICES

(71) Applicant: SYNOPSYS, INC., Mountain View, CA (US)

(72) Inventors: Victor Moroz, Saratoga, CA (US); Xi-Wei Lin, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/584,786

(22) Filed: Dec. 29, 2014

(65) Prior Publication Data

US 2015/0143306 A1 May 21, 2015

Related U.S. Application Data

(63) Continuation of application No. 13/101,665, filed on May 5, 2011, now abandoned.

(51) Int. Cl.
*G06F 17/50* (2006.01)
*H01L 21/308* (2006.01)

(52) U.S. Cl.
CPC ....... *G06F 17/5068* (2013.01); *H01L 21/3086* (2013.01)

(58) Field of Classification Search
CPC .. G06F 17/5068; G06F 17/50; G06F 17/5072; G06F 17/5077; G06F 3/04812; H01L 21/3086; H01L 27/0207; H01L 21/76877; G03F 1/14; G03F 1/144
See application file for complete search history.

(56) References Cited

U.S. PATENT DOCUMENTS

| | | | |
|---|---|---|---|
| 7,687,369 B2 | 3/2010 | Koh et al. | |
| 7,799,592 B2 | 9/2010 | Lochtefeld | |
| 7,856,613 B1 | 12/2010 | Weling et al. | |
| 7,998,874 B2 | 8/2011 | Lee et al. | |

(Continued)

OTHER PUBLICATIONS

TW 101115448—Notice of Allowance dated Aug. 10, 2015, 2 pages.

(Continued)

*Primary Examiner* — Nha Nguyen
(74) *Attorney, Agent, or Firm* — Haynes Beffel & Wolfeld LLP

(57) ABSTRACT

An integrated circuit device having a plurality of lines is described in which the widths of the lines, and the spacing between adjacent lines, vary within a small range which is independent of variations due to photolithographic processes, or other patterning processes, involved in manufacturing the device. A sequential sidewall spacer formation process is described for forming an etch mask for the lines, which results in first and second sets of sidewall spacers arranged in an alternating fashion. As a result of this sequential sidewall spacer process, the variation in the widths of the lines across the plurality of lines, and the spacing between adjacent lines, depends on the variations in the dimensions of the sidewall spacers. These variations are independent of, and can be controlled over a distribution much less than, the variation in the size of the intermediate mask element caused by the patterning process.

15 Claims, 15 Drawing Sheets

(56) References Cited

U.S. PATENT DOCUMENTS

| | | | |
|---|---|---|---|
| 8,101,520 B2 | 1/2012 | Kim | |
| 2005/0224877 A1 | 10/2005 | Liaw | |
| 2007/0065990 A1* | 3/2007 | Degroote | H01L 21/0337 438/142 |
| 2007/0172770 A1 | 7/2007 | Witters et al. | |
| 2008/0122125 A1 | 5/2008 | Zhou | |
| 2008/0131793 A1 | 6/2008 | Lee et al. | |
| 2008/0200026 A1 | 8/2008 | Koh et al. | |
| 2008/0235650 A1 | 9/2008 | Ito et al. | |
| 2009/0068838 A1 | 3/2009 | Kim et al. | |
| 2009/0095997 A1 | 4/2009 | Wells et al. | |
| 2009/0159972 A1* | 6/2009 | Jakschik | H01L 21/84 257/350 |
| 2009/0271758 A1 | 10/2009 | Wells | |
| 2010/0205575 A1* | 8/2010 | Arora | G06F 17/5068 716/122 |
| 2010/0248481 A1 | 9/2010 | Schultz | |

OTHER PUBLICATIONS

CN 2012800308967—Office Action dated Aug. 4, 2015, 6 pages.
KR-2013-7031902—Notice of Allowance dated Sep. 11, 2015, 3 pages.
KR 2013-7031902—Office Acton dated Mar. 20, 2015, 11 pages.
PCT/US2012/035997—International Search Report and Written Opinion dated Feb. 1, 2013, 14 pages.
Choi et al., "A spacer patterning technology for nanoscale CMOS," IEEE Transactions on Electron Devices, vol. 49, No. 3, pp. 436-441, Mar. 2002.
TW 101115448—Office Action dated Oct. 16, 2014, 12 pages.
CN 2012800308967—Response to Office Action dated Aug. 4, 2015, 7 pages.
CN 2012800308967—Second Office Action dated Jan. 8, 2016, 9 pages.
CN 2012800308967—Response to Second Office Action dated Jan. 8, 2016, 10 pages.

* cited by examiner ated circuit devices which overcome or alleviate issues caused by critical dimension variations introduced by photolithographic processes, thereby improving performance and manufacturing yield of such devices.

METHODS FOR FABRICATING HIGH-DENSITY INTEGRATED CIRCUIT DEVICES

CROSS-REFERENCE TO RELATED APPLICATIONS

This application is a continuation of U.S. application Ser. No. 13/101,665, filed 5 May 2011, entitled "METHODS FOR FABRICATING HIGH-DENSITY INTEGRATED CIRCUIT DEVICES," by Victor Moroz and Xi-Wei Lin and (Atty. Docket No. SYNP 1722-1), which application is incorporated herein by reference in its entirety.

BACKGROUND

Field of the Invention

The present invention relates to integrated circuit fabrication, and more particularly to methods of fabricating high-density integrated circuit devices.

Description of Related Art

Photolithographic processes can be used to form various types of integrated circuit structures on a semiconductor wafer. In photolithography, features of these structures are typically created by exposing a mask pattern (or reticle) to project an image onto a wafer that is coated with light sensitive material such as photo resist. After exposure, the pattern formed in the photo resist may then be transferred to an underlying layer (e.g. metal, polysilicon, etc.) through etching to create the desired features.

One problem associated with manufacturing devices having very small features arises because of the line width variation (or Critical Dimension, CD) introduced by the photolithographic processes. Specifically, resist material properties, process conditions and other factors can cause random variations in the width and spacings of a patterned line of resist over its length. The variation along just one edge is called line edge roughness (LER).

In a typical lithographic patterning process, a series of parallel lines of resist are used as an etch mask to create a corresponding series of parallel lines of material in the underlying layer. In such a case, random variations in the patterned parallel lines of resist will be transferred to the critical dimensions of the parallel lines in the underlying layer. As process technologies continue to shrink, this random variation becomes a greater percentage of the critical dimension of the parallel lines of material, which can result in significant performance variability in devices such as transistors implemented utilizing these lines of material.

In addition, such a process will result in random, uneven variations in the spacing between the adjacent parallel lines of resist, which in turn is transferred to the spacing between the adjacent lines of material. This uneven spacing introduces variations in the thermal stress induced on either side of a given line of material during manufacturing, which can result in reliability issues and reduce yield. For example, a typical fabrication technique includes forming shallow trench isolation (STI) structures of insulator material between lines of silicon. During the manufacturing process, these structures undergo thermal cycling which introduces thermo-mechanical stresses between the silicon and the adjacent STIs. The difference in spacing on either side of a given line of material results in variations in the induced thermal stresses on either side, which can significantly deform and possibly cause the silicon to fall over during manufacturing.

Accordingly, it is desirable to provide high-density integrated circuit devices which overcome or alleviate issues caused by critical dimension variations introduced by photolithographic processes, thereby improving performance and manufacturing yield of such devices.

SUMMARY

An integrated circuit device having a plurality of lines is described in which the widths of the lines, and the spacing between adjacent lines, vary within a small range which is independent of variations due to photolithographic processes, or other patterning processes, involved in manufacturing the device. A sequential sidewall spacer formation process is described for forming an etch mask for the lines, which results in first and second sets of sidewall spacers arranged in an alternating fashion. The sidewall spacers in the first and second sets originate from a single sidewall surface of an intermediate mask element, such as a patterned resist element. The first and second sets of sidewall spacers are formed by iteratively depositing a conformal layer of material having a thickness on a sidewall, and then performing a directional etch process which leaves the material on the sidewall, while alternating the deposition between the materials of the first and second sets. The first set of sidewall spacers comprise a material, such as silicon oxide, that can be selectively etched relative to a material, such as silicon nitride, of the second set of sidewall spacers. One of the first and second sets of sidewall spacers defines the etch mask used to form the lines during an etching process. As a result of this sequential sidewall spacer process, the variation in the widths of the lines across the plurality of lines, and the spacing between adjacent lines, depends on the variations in the dimensions of the sidewall spacers. These variations to the sidewall spacers are independent of, and can be controlled over a distribution much less than, the variation in the shape of the sidewall surface of the intermediate mask element caused by the patterning process.

A method for manufacturing an integrated circuit device described herein includes providing a material layer, such as a semiconductor substrate. A first set of sidewall spacers and a second set of sidewall spacers are formed on the material layer. The first and second sets of sidewall spacers are arranged in an alternating fashion, so that adjacent sidewall spacers in the first set are separated by a single sidewall spacer in the second set, and adjacent sidewall spacers in the second set are separated by a single sidewall spacer in the first set. The material layer is then etched using one of the first and second sets of sidewall spacers as an etch mask, thereby forming a plurality of trenches in the material layer at locations defined by the other of the first and second sets of sidewall spacers.

The sequential sidewall spacer formation process described herein can also be incorporated into a technology-specific (characterized) cell library for carrying out an integrated circuit design using Electronic Design Automation (EDA) analysis tools.

An article of manufacture as described herein includes a machine readable data storage medium storing a design entry for an integrated circuit. The design entry includes a layout comprising a plurality of lines to be formed in a material layer during fabrication of an integrated circuit device. The design entry also includes a mask layer to be formed overlying the material layer during fabrication of the plurality of lines. The mask layer specifies an intermediate mask element having a single edge for fabricating the entire plurality of lines.

An integrated circuit device as described herein includes a first plurality of lines separated from a second plurality of lines by a minimum spacing at least twice a width of a particular line in the first plurality of lines. Each line in the first plurality of lines has a first line width roughness and a first line edge roughness less than the first line width roughness. Each line in the second plurality of lines has a second line width roughness and a second line edge roughness less than the second line width roughness. All the lines in the first plurality of lines having a longitudinal curvature different from each of the lines in the second plurality of lines.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Other aspects and advantages of the present invention can be seen on review of the drawings, the detailed description, and the claims which follow.

DETAILED DESCRIPTION

The following description is presented to enable any person skilled in the art to make and use the invention, and is provided in the context of a particular application and its requirements. Various modifications to the disclosed embodiment will be readily apparent to those skilled in the art, and the general principles defined herein may be applied to other embodiments and applications without departing from the spirit and scope of the present invention. Thus, the present invention is not intended to be limited to the embodiments shown, but is to be accorded with the widest scope consistent with the principles and features disclosed herein.

Figure 1:
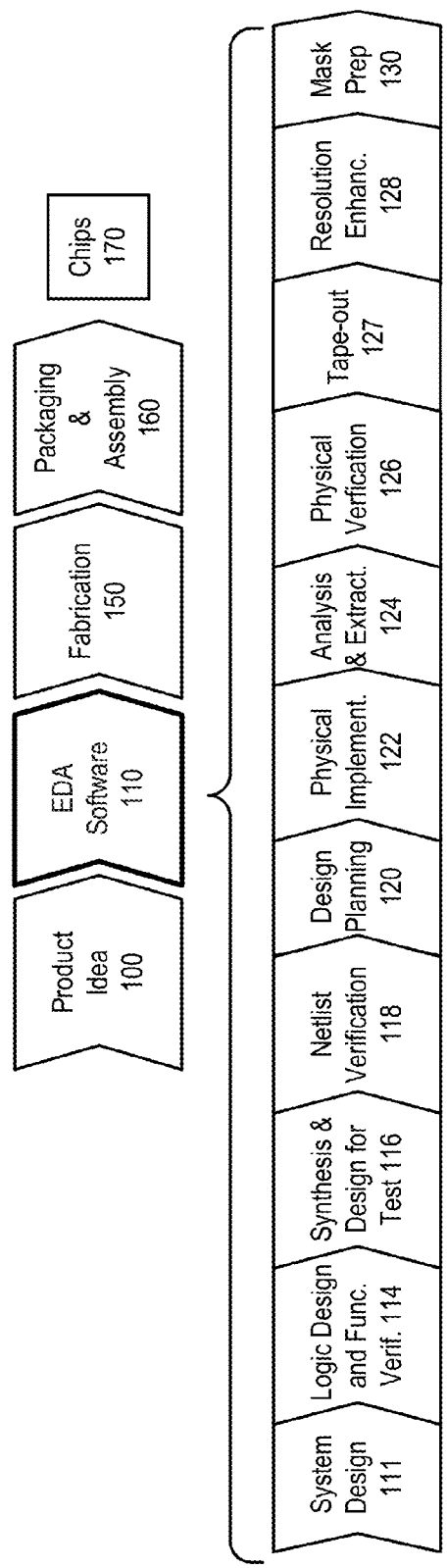
FIG. 1 shows a simplified representation of an illustrative digital integrated circuit design flow incorporating aspects of the present invention

FIG. 1 shows a simplified representation of an illustrative digital integrated circuit design flow incorporating aspects of the present invention. As with all flowcharts herein. it will be appreciated that many of the steps of FIG. 1 can be combined, performed in parallel or performed in a different sequence without affecting the functions achieved. In some cases a rearrangement of steps will achieve the same results only if certain other changes are made as well, and in some cases a rearrangement of steps will achieve the same results only if certain conditions are satisfied. Such rearrangement possibilities will be apparent to the reader.

At a high level, the process starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

Embodiments of the sequential sidewall spacer formation process described herein can be used in the fabrication process (block 150). In addition, the sequential sidewall spacer formation process described herein can also be incorporated into a technology-specific (characterized) cell library for use in the EDA software design process (block 110).

The EDA software design process (block 110) is composed of a number of steps 111-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit. A brief description of the components steps of the EDA software design process (step 110) will now be provided:

System design (block 111): The designers describe the functionality that they want to implement, they can perform what-if planning to refine functionality, check costs, etc. Hardware-software architecture can occur at this stage. Example EDA software products from Synopsys, Inc. that can be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (block 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Compiler, FPGA Compiler, TetraMAX, and DesignWare® products.

Netlist verification (block 118): At this step, the netlist is checked for compliance with timing constraints and for correspondence with the VHDL/Verilog source code.

Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (block 124): At this step, the circuit function is verified at a transistor level, this in turn permits what-if refinement. Example EDA software products from Synopsys, Inc. that can be used at this stage include AstroRail, PrimeRail, Primetime, and Star RC/XT products. Parasitic extraction from the placed and routed circuit design is complemented with timing information from the design library to produce final timing values, which can be used for verification and for identifying circuit paths that have usable slack.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Tape-out (block 127): This stage provides the "tape-out" data for production of masks for lithographic use to produce finished chips. Example EDA software products from Synopsys, Inc. that can be used at this stage include the CATS® family of products.

Resolution enhancement (block 128): This stage involves geometric manipulations of the layout to improve manufacturability of the design. Aerial image simulation based on convolution algorithms executed using multi-core processing systems as described herein, can be used in this stage of the design, as well as other stages. Example EDA software products from Synopsys, Inc. that can be used at this stage include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS® family of products.

Another process involved in EDA, not shown separately in FIG. 1, includes characterization of the cells that can be implemented using a target technology, to create a design entry for a cell library utilized for placement and routing functions during physical implementation. The design entry may be for example a logic cell library entry or a memory block. The memory block may for example be 4, 8, 16, 32 or 64 cells wide. In the following discussion, a design entry is described in the context of a logic cell library entry. It will be understood that the techniques described herein can also be implemented in a memory block or other type of design entry.

A standard cell library can include a collection of entries that can be fabricated using a manufacturing line, including characterizing data for cells defining low level logic functions such as NAND, AND, NOR, OR, INVERT, flip-flops, latches and buffers involving relatively small numbers of transistors. The cells are typically optimized, full custom layouts for a specific implementing technology, which minimizes the delays and area. A typical standard cell library contains layout data, functional definitions, delay information, power information and noise information for each cell. The entries for the cells in the library can include other information, such as SPICE models of the cells, high level description language models, parasitic extraction models and design rule checking decks.

Embodiments of the characterized cell library implementing the sequential sidewall spacer formation process technology described herein can be used during one or more of the above-described stages.

FIGS. 2-10 illustrate stages in a manufacturing process flow of an embodiment of the sequential sidewall spacer formation process described herein. It will be understood that the process steps and structures described with reference to FIGS. 2-10 do not describe a complete process for the manufacturing of an integrated circuit device. The sequential sidewall spacer formation process described herein can be utilized in the manufacturing of various types of integrated circuit components.

Figure 2A:
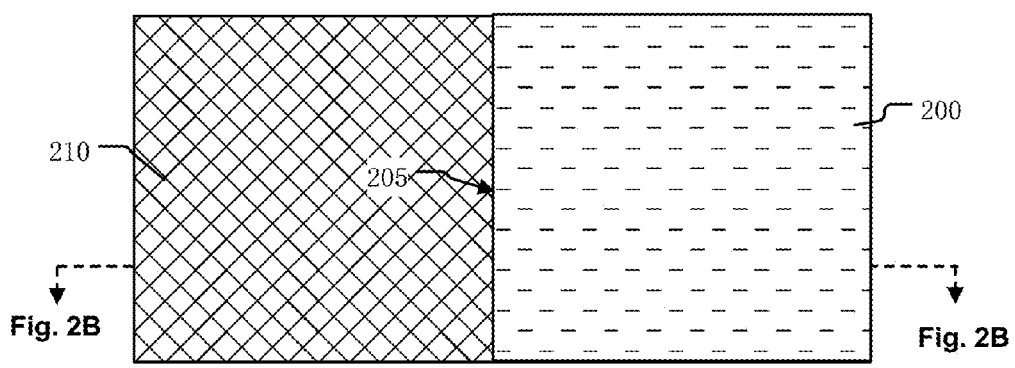
FIGS. 2A, 2B, 3A, 3B, 4A, 4B, 5A, 5B, 6A, 6B, 7A, 7B, 8A, 8B, 9A, 9B, 10A and 10B illustrate stages in a manufacturing process flow of an embodiment of the sequential sidewall spacer formation process described herein.
Figure 2B:
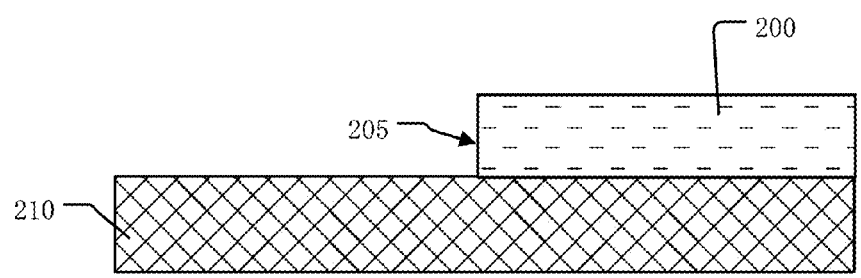

FIGS. 2A and 2B illustrate top and cross-sectional views respectively of an intermediate mask element 200 patterned on a material layer 210. The intermediate mask element 200 has a sidewall surface 205. The intermediate mask element 200 may be formed for example by patterning a layer of photoresist using a lithographic process. Other materials may alternatively be used for the intermediate mask element 200. The material layer 210 may for example comprise silicon or other semiconductor material. Alternatively, the material layer 210 may comprise other materials, and may be an intermediate layer between semiconductor material and the mask element 200.

Figure 3A:
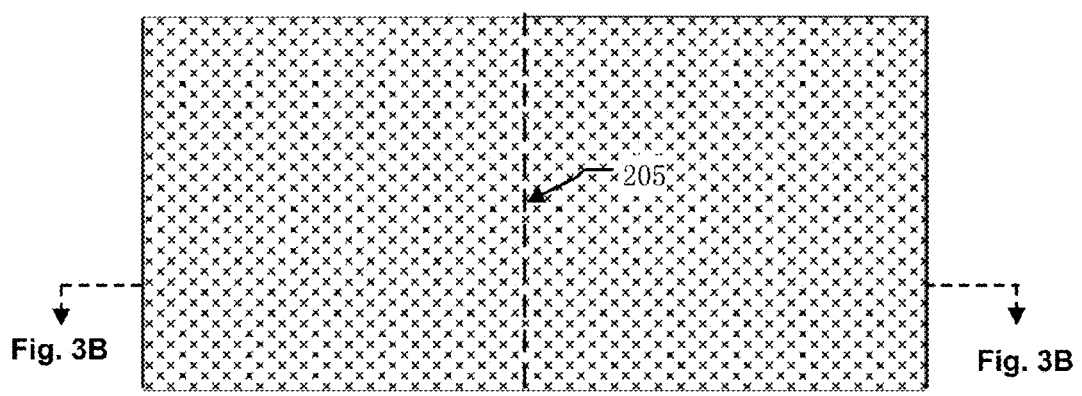
Figure 3B:
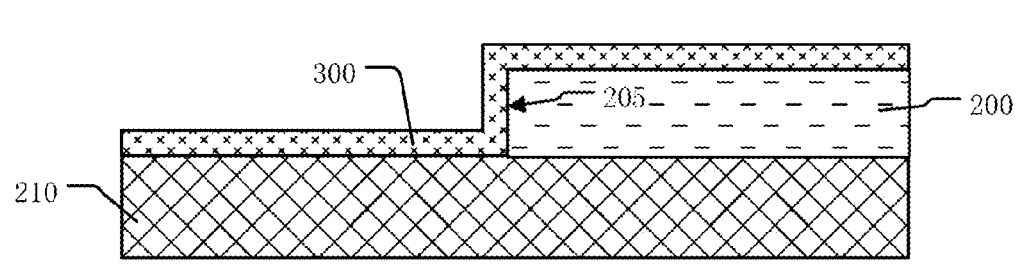
Figure 4A:
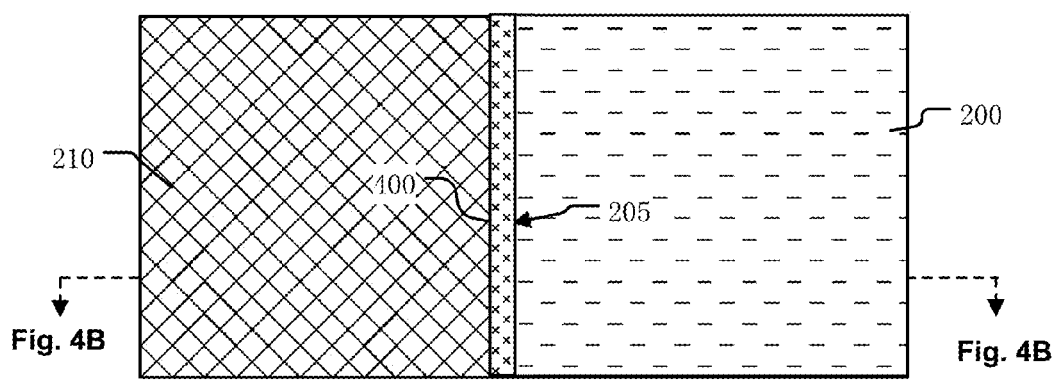
Figure 4B:
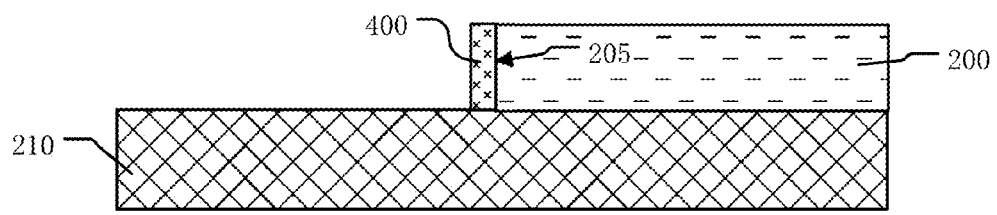

Next, a conformal first material layer 300 is formed on the structure illustrated in FIGS. 2A and 2B, resulting in the structure illustrated in the top and cross-sectional views of FIGS. 3A and 3B. As can be seen in FIGS. 3A and 3B, the first material layer 300 is on the sidewall surface 205 of the intermediate mask element 200. The first material layer 300 may be formed for example using chemical vapor deposition (CVD).

Next, an anisotropic etching process, such as a reactive ion etch, is performed on the first material layer 300 to remove some of the first material layer 300, thereby forming sidewall spacer 400 on the sidewall surface 205. The resulting structure is illustrated in the top and cross-sectional views of FIGS. 4A and 4B.

Figure 5A:
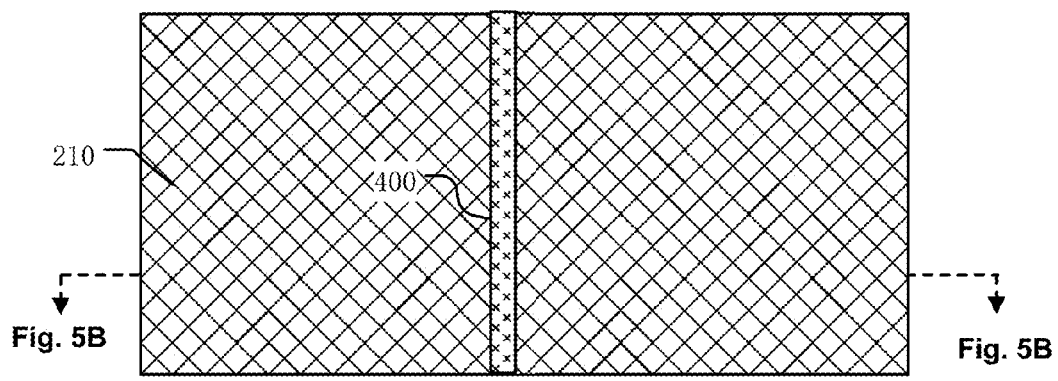
Figure 5B:
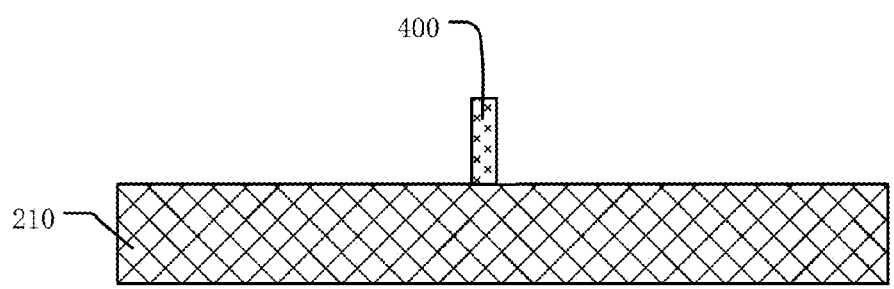

After the sidewall spacer 400 is formed, the intermediate mask element 200 is removed, resulting in the structure illustrated in the top and cross-sectional views of FIGS. 5A and 5B.

Figure 6A:
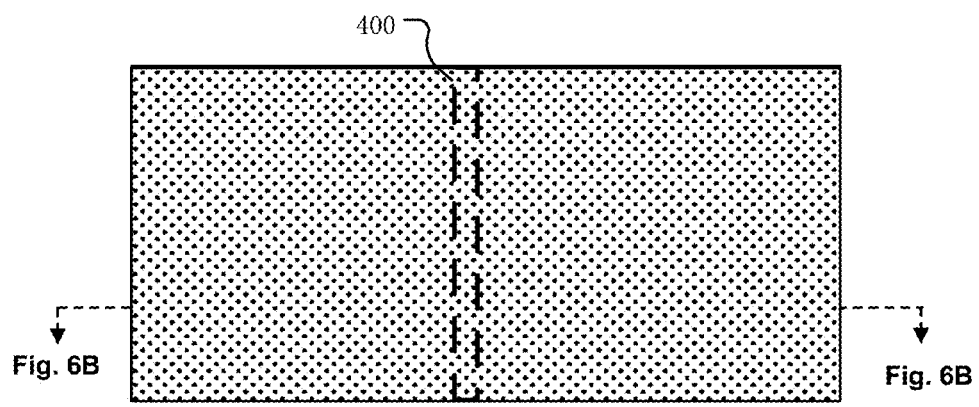
Figure 6B:
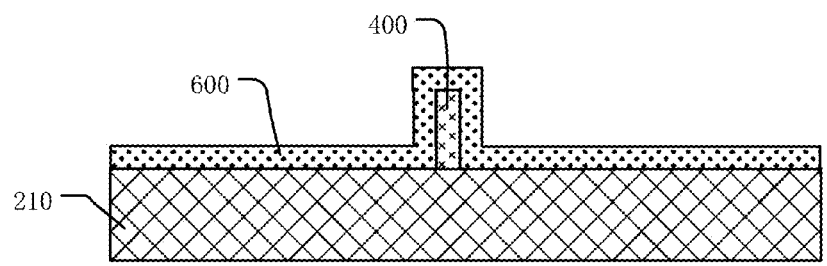

Next, a conformal second material layer 600 is formed on the structure illustrated in FIGS. 5A and 5B, resulting in the structure illustrated in the top and cross-sectional views of FIGS. 6A and 6B. The materials of the second material layer 600 and the sidewall spacer 400 (i.e. the material of the first material layer 300) are chosen for the ability to be selectively etched, as described below. In the illustrated embodiment the second material layer 600 is silicon dioxide and the sidewall spacer 400 is silicon nitride.

Figure 7A:
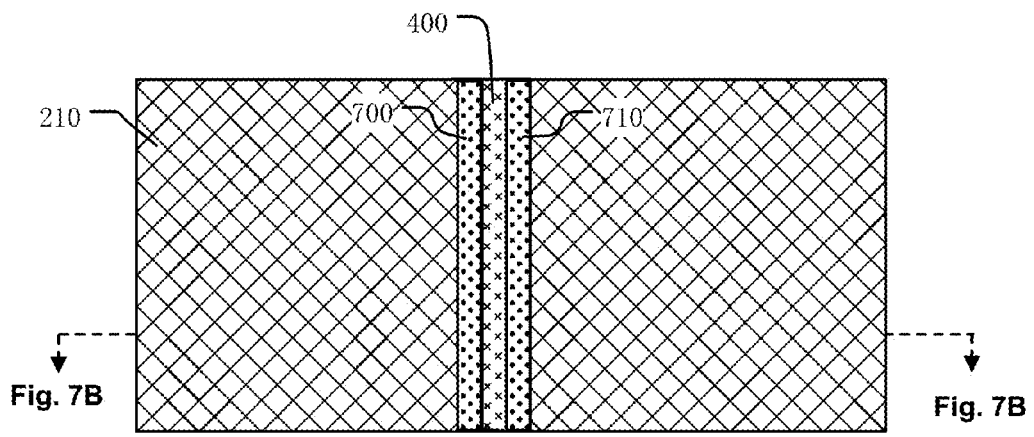
Figure 7B:
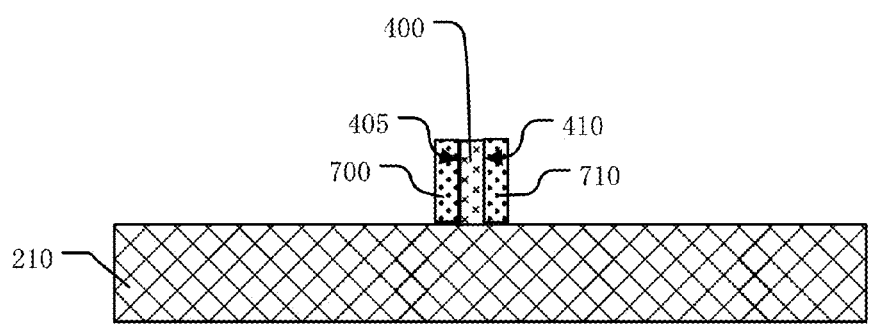

An anisotropic etching process is then performed on the second material layer 600 to form sidewall spacer 700 on a first sidewall surface 405 of the sidewall spacer 400, and form sidewall spacer 710 on a second opposing sidewall surface 410 of the sidewall spacer 400, resulting in the structure illustrated in FIGS. 7A and 7B.

Next, a conformal third material layer composed of a material the same as or similar to that of the first material layer 300 is formed on the structure illustrated in FIGS. 7A and 7B. The conformal third material layer is then anisotropically etched to form sidewall spacer 800 on a sidewall surface 705 of the sidewall spacer 700, and form sidewall spacer 810 on a sidewall surface 715 of the sidewall spacer 710, resulting in the structure illustrated in FIGS. 8A and 8B.

Figure 8A:
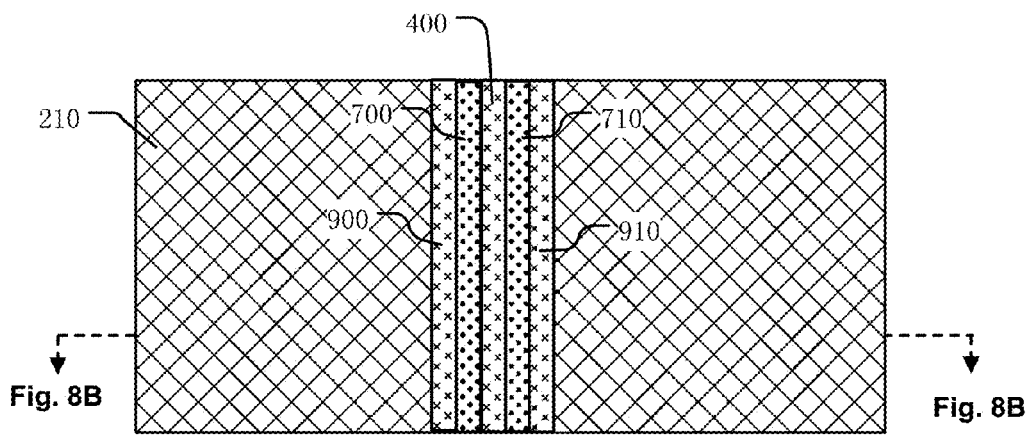
Figure 8B:
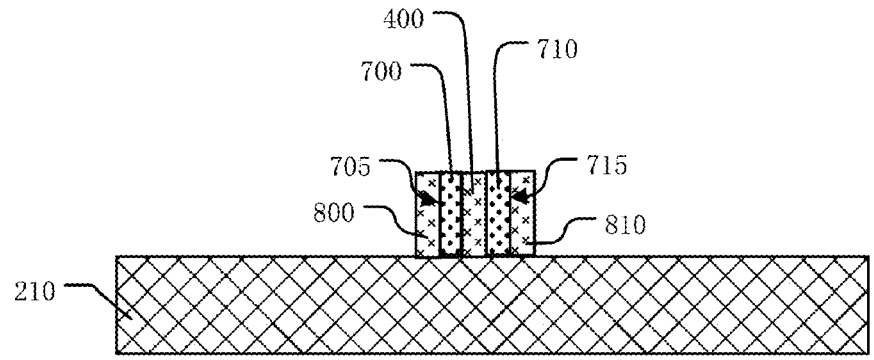

The sidewall spacers 400, 800 and 810 are collectively referred to herein as a first set of sidewall spacers. The sidewall spacers 700, 710 are collectively referred to herein as a second set of sidewall spacers. As can be seen in FIGS. 8A-8B, the first and second sets of sidewall spacers are arranged in an alternating fashion, so that adjacent sidewall spacers in the first set are separated by a single sidewall spacer in the second set, and adjacent sidewall spacers in the second set are separated by a single sidewall spacer in the first set. As used herein, two items are "adjacent" to each other if they are not separated by another item of the same type. For example, two lines are considered "adjacent" to each other if there is no intervening line between them, even if the two lines do not touch each other. Immediate adjacency is not required by the term adjacent unless called for explicitly. As described in more detail below, etching is subsequently performed in the material layer 210 using one of the first and second sets of sidewall spacers as an etch mask, thereby forming a plurality of trenches in the material layer 210 at locations defined by the other of the first and second sets of sidewall spacers.

Figure 9A:
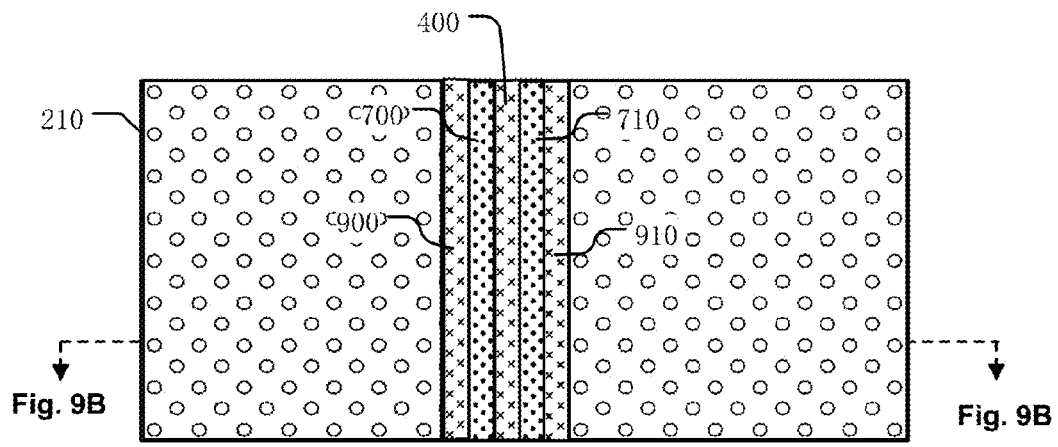
Figure 9B:
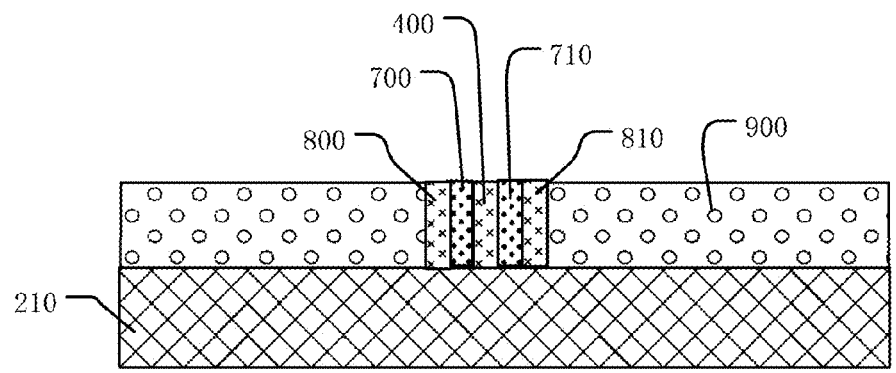
Figure 10A:
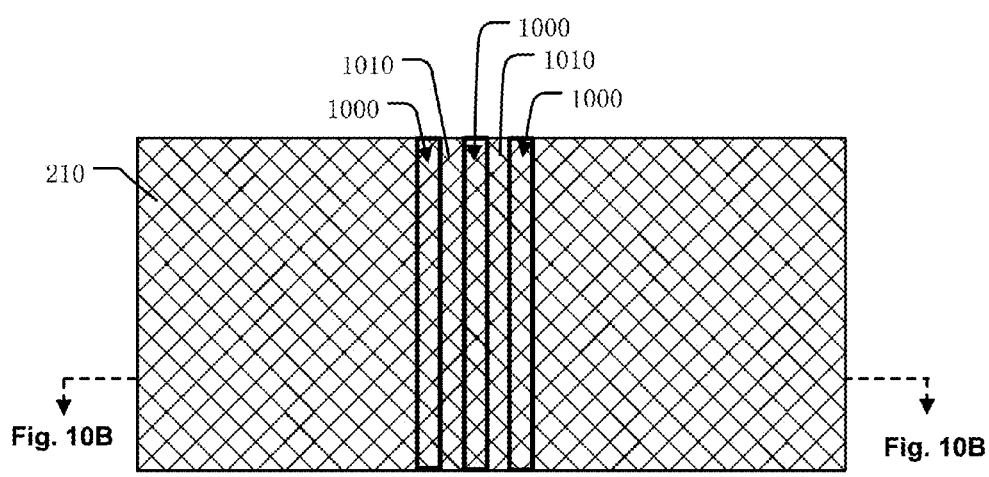
Figure 10B:
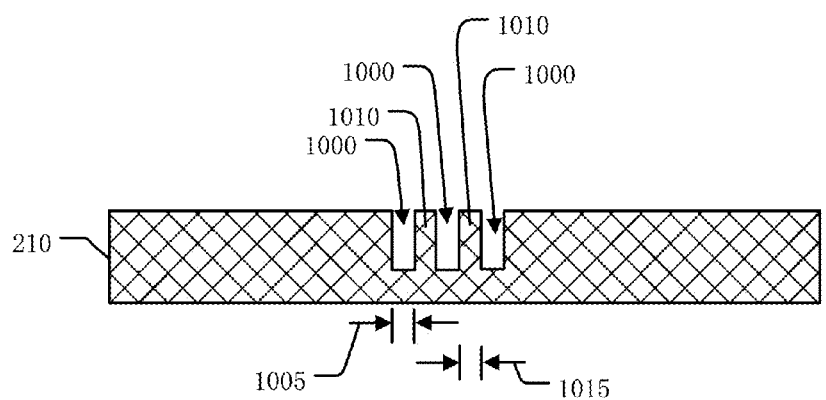

Next a fill material 900 is deposited and a planarazation process such as Chemical Mechanical Polishing (CMP) is performed, resulting in the structure illustrated in FIGS. 9A and 9B.

Next, the first set of sidewall spacers (sidewall spacers 400, 800 and 810) are removed to expose a top surface of the material layer 210. Next, the material layer 210 is etched using the second set of spacers (sidewall spacers 700, 710) as an etch mask to form trenches 1000 extending into the material layer 210 at locations defined by the first set of sidewall spacers (sidewall spacers 400, 800 and 810). The fill material 900 and the second set of spacers are then removed, resulting in the structure illustrated in FIGS. 10A and 10B.

Adjacent trenches 1000 define lines of material 1010 in the material layer 210. The trenches 1000 have trench widths 1005. The lines of material 1010 have line widths 1015. The trench widths 1005 and lines widths 1015 can for example be less than or equal to 15 nm.

In the illustrated example, the etch mask is the second set of sidewall spacers (700, 710). Alternatively, the etch mask may be the first set of sidewall spacers (400, 800, 810).

In the illustrated example, two lines of material 1010 are formed in the material layer 210. The techniques described above for forming the alternating sidewall spacers in the first and second sets can be also repeated any number of times to form additional sidewall spacers prior to etching, such that any number of lines of material can be formed in the material layer 210.

In alternative embodiments, rather than etching the material layer 210 following removal of the first set of sidewall spacers, a second material layer may be formed on the exposed top surface of the material layer 210 to define lines of the second material layer. The second material layer may for example be grown epitaxially on the exposed top surface of the material layer 210. The remaining spacers may then be partially etched to expose side surfaces of the second material layer, so that FinFETs can be formed.

As a result of the sequential sidewall spacer process illustrated in FIGS. 2-10, the trench widths 1005 and the line widths 1015 can be very uniform, and substantially the same from trench to trench and line to line across the device. The term "substantially" as used herein is intended to accommodate manufacturing tolerances. For example, the variation in trench width 1005 and/or line width 1015 for a given trench or line can be less than 10%. In addition, the variation in trench widths 1005 and line widths 1015 across the device can be less than 10%. These small variations arise because the trench widths 1005 and the line widths 1015 have respective variations from trench-to-trench and line-to-line that are dependent upon the variations in the dimensions of the first and second sets of sidewall spacers used to form them. The variations in the sidewall spacers are in turn determined by the thin film deposition techniques and anisotropic etch conditions, which can be readily and repeatedly controlled. As a result, these variations in trench widths 1005 and line widths 1015 are independent of, and controlled over a distribution much less than, variations due to photolithographic processes, or other patterning processes, involved in formation of the intermediate mask element 200. Therefore, integrated circuit elements, such as FinFET transistors, interconnect lines or other small features such as nano-wires, implemented utilizing the lines of material 1010 will exhibit very uniform performance across the device. Furthermore, since the trench widths 1005 are uniform and substantially the same from trench to trench, a given line of material 1010 will exhibit similar thermal stresses on either side, such as may occur during subsequent manufacturing processes. As a result, the techniques described herein provide high-density integrated circuit devices exhibiting uniform performance and high yield in a way not possible in the prior art.

In the examples described above, the sequential sidewall spacer process was carried out on a single sidewall surface of the intermediate mask element. In some embodiments, the techniques described herein can be carried out by simultaneously utilizing opposing sidewall surfaces of an intermediate mask element. In such a case, third and fourth sets of sidewall spacers can be formed in a similar alternating fashion utilizing another sidewall surface of the intermediate mask element. One of the third and fourth sets of sidewall spacers can then be used as an etch mask during the etching process, thereby forming another plurality of trenches and lines.

In the simplified plan view in FIG. 2A, the sidewall surface 205 of the intermediate mask element 200 is shown width ideal straight line. In practical devices, the sidewall surface 205 will have variations in shape as a result of imperfections in the patterning process used to form the intermediate mask element 200. The shape of the sidewall surface 205 as a result of these imperfections has an associated line edge roughness. The term "line edge roughness" (LER) as used herein refers to a statistical measure, such as the standard deviation, of the actual positions of the edge relative to the mean line edge position along a segment of the line. As used herein, the term "line width roughness" (LWR) refers to a statistical measure, such as the standard deviation, of the actual line width relative to the mean line width along the length of a segment of the line.

Figure 11:
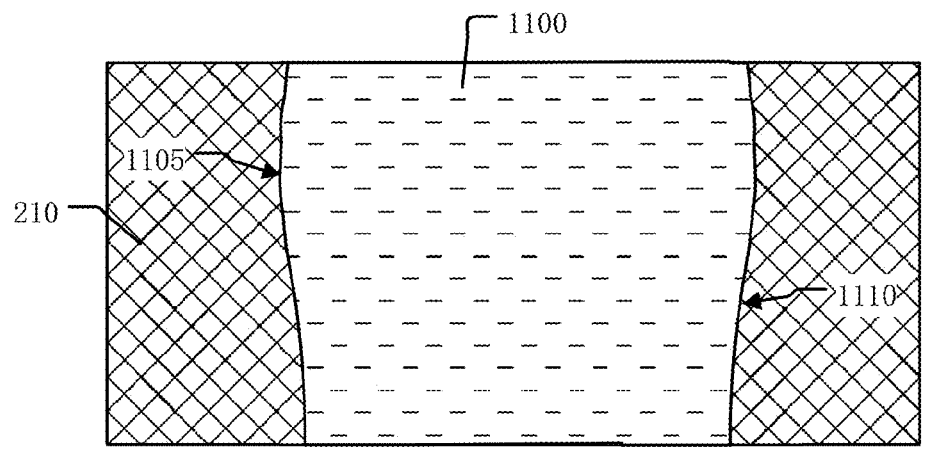
FIG. 11 illustrates a plan view of an intermediate mask element having a sidewall surface with a pronounced line edge roughness.
Figure 12:
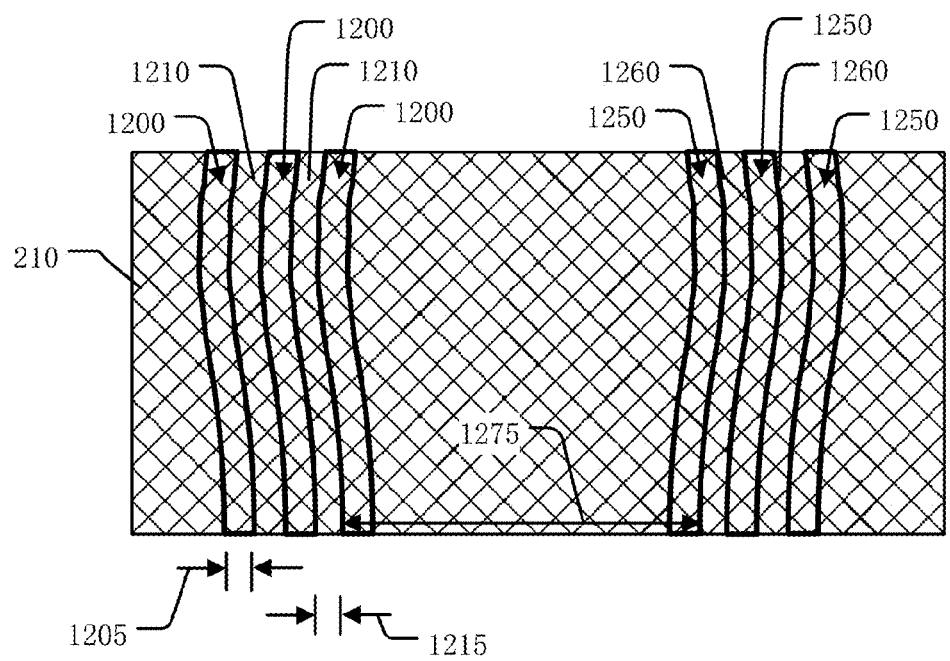
FIG. 12 illustrates a plan view of lines and trenches manufactured using the intermediate mask element illustrated in FIG. 11.

FIG. 11 illustrates a plan view of an intermediate mask element 1100 having a first sidewall surface 1105 with a first pronounced LER, and a second sidewall surface 1110 having a second pronounced LER. FIG. 12 illustrates a plan view of lines 1210 and trenches 1200, and lines 1260 and trenches 1250, manufactured by the process illustrated in FIGS. 3-10, using the intermediate mask element 1100 in place of the intermediate mask element 200.

As shown in FIGS. 11 and 12, the variation in the shape of the sidewall surface 1105 is carried through to the shape of the edges of the first lines 1210. Similarly, the variation in the shape of the sidewall surface 1110 is carried through to the shape of the edges of the second lines 1260.

Since the sidewall spacers used to define the location of the trenches 1200 and lines 1210 originate from the single sidewall surface 1105, the process forms the lines 1210 in a self-aligned and self-spaced manner. As described above, the thin film deposition techniques and anisotropic etch conditions can be readily controlled, such that the variation in the dimensions of the sidewall spacers originating from the sidewall surface 1105 are much less than the variation in the sidewall surface 1105. As a result, the shape (or contour) of the sidewall surface 1105 is carried through in substantially the same way to the shape of each of the corresponding sidewall spacers, and thus though to the shape of the each of the lines 1210 and trenches 1200. Therefore, the shapes of the lines 1210 and the shapes of the trenches 1200 are correlated, such that the locations of the edges of the each of lines 1200 fluctuate in a substantially synchronous manner. As a result, the variation in the line width 1215 of a given line of material 1200 is essentially independent of, and can be controlled over a distribution much less than, the variations in the locations of the opposing sides that define the line width 1215. For the same reason, the variation in the width 1205 of a given trench 1210 is essentially independent of, and can be controlled over a distribution much less than, the variations in the locations of the sides of adjacent lines that define the width of the trench 1200. In other words, the LWR of each particular line 1210 is substantially less than the LER of each of the sides that define the width of the particular line 1210. Similarly, the LWR of each particular line 1260 originating from the second sidewall surface 1110 is substantially less than the LER of each of the sides that define the width of the particular line 1260.

As an example, using a lithographic process, the LER of the sidewall surface 1105 of the intermediate mask element 1100 may be 6 nm. As explained above, this LER is transferred to the edges of each of the lines 1210 in a coherent, synchronous manner. As a result, the LWR of each of the lines 1210 will be much smaller, such as for example 1 nm. This results in each line 1210 having a critical dimension variation which is substantially less than the variation in the photolithographic or other patterning process.

As a result of the conformal nature of the sidewall process, the lines 1210 are spaced apart along a direction normal to the sidewall surface 1105. In addition, the plan view contour of the sidewall surface 1105 is representative of the lines 1210 and the trenches 1200. Furthermore, as a result of the differences in the shape of the sidewall surface 1105 and the sidewall surface 1110 caused by variations in the patterning process, all of the first lines 1210 have a longitudinal curvature different from each of the second lines 1260.

As shown in FIGS. 11 and 12, the non-uniform width of the intermediate mask element 1100 due to the differences between the shapes of the sidewall surfaces 1105, 1110, results in an unequal spacing between the first lines 1210 and the second lines 1260. In order to alleviate or overcome the issues associated with unequal thermo-mechanical stresses which can be introduced as a result of non-uniform spacing between lines, the first lines 1210 are separated from the second lines 1260 by a minimum spacing 1275. The minimum spacing 1275 is at least twice the width of a particular line in the first and second lines 1210, 1260.

As used herein, the term "line" does not necessarily imply a shape having substantially straight lines parallel to one another. For example, the sidewall surface of the intermediate mask element may be in the form of an arc having a radius of curvature. In such a case, the lines are formed as nested arcs.

In the illustrated example, the trench widths 1205 and the line widths 1215 are substantially the same. As a result, the lines and trenches have substantially congruent shapes. This arises because the dimensions of the first set of sidewall spacers are substantially the same as the dimensions of the second set of sidewall spacers in the illustrated example. Alternatively, the dimensions of the first set of sidewall spacers may be different from the dimensions of the second set of sidewall spacers, by varying the deposition and etching processes used to form them. For example, the first set of sidewall spacers may be formed by a first process, such that the trench widths having a first nominal value which is substantially the same from trench to trench. The second set of sidewall spacers may be formed by a second process, such that the line widths have a second nominal value different from the first nominal value, and which is substantially the same from line to line.

As mentioned above, the sequential sidewall spacer formation process described herein can also be incorporated into a technology-specific (or characterized) cell library for use in the EDA software design process.

Figure 13:
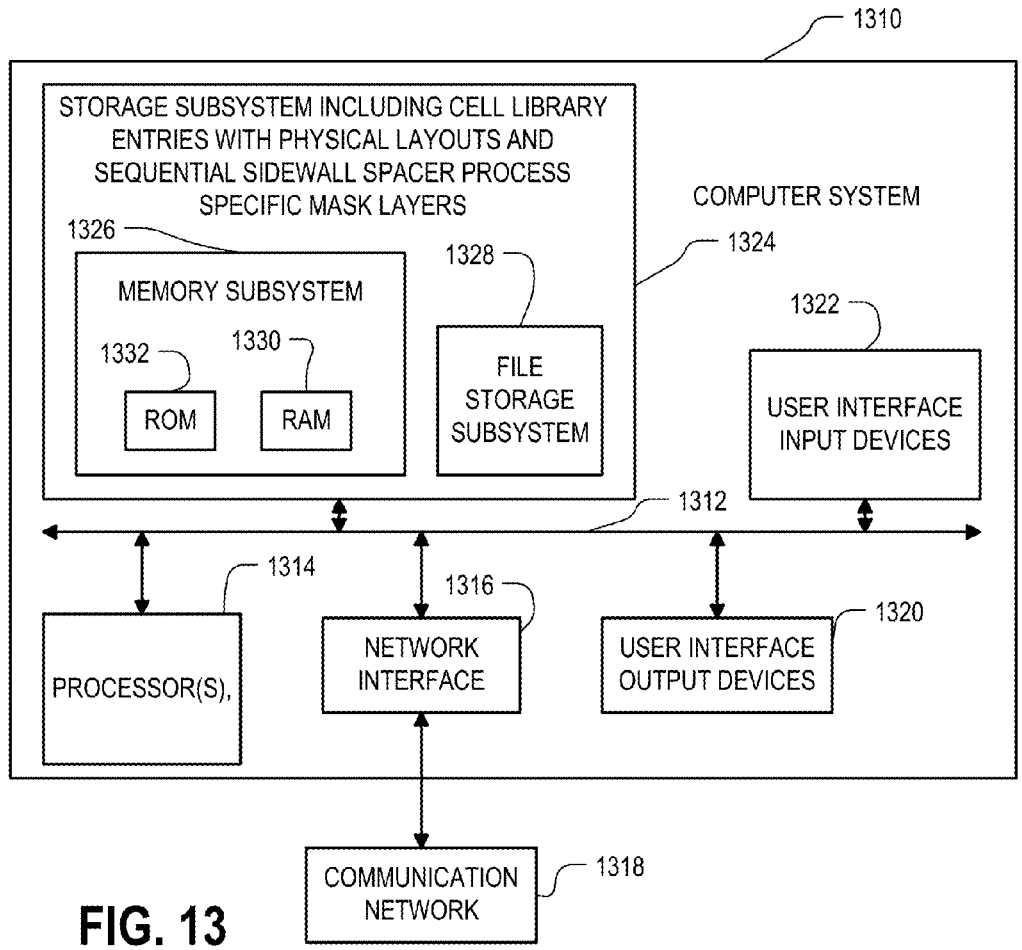
FIG. 13 is a simplified block diagram of a computer system suitable for use with embodiments of the technology.

FIG. 13 is a simplified block diagram of a computer system 1310 suitable for use with embodiments of the technology. Computer system 1310 typically includes processor(s) 1314 which can communicate with a number of peripheral devices via a bus subsystem 1312.

The peripheral devices may include a storage subsystem 1324, comprising a memory subsystem 1326 and a file storage subsystem 1328, user interface input devices 1322, user interface output devices 1320, and a network interface subsystem 1316. The input and output devices allow user interaction with the computer system 1310. Network interface subsystem 1316 provides an interface to outside networks, including an interface to communication network 1318, and is coupled via communication network 1318 to corresponding interface devices in other computer systems. Communication network 1318 may comprise many interconnected computer systems and communication links. These communication links may be wireline links, optical links, wireless links, or any other mechanisms for communication of information. While in one embodiment, communication network 1318 is the Internet, in other embodiments, communication network 1318 may be any suitable computer network.

User interface input devices 1322 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 1310 or onto communication network 1318.

User interface output devices 1320 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devise. In general, use of the term "output device" is intended to include all possible types of devices and ways to output information from computer system 1310 to the user or to another machine or computer system. User interface output devices 1320 can be used for providing graphic displays of the results of the operations described herein.

Storage subsystem 1324 stores the basic programs of instructions and data constructs that provide the functionality of some or all of the EDA tools described herein, including technology-specific (characterized) cell library entries incorporating the specifics of the sequential sidewall spacer formation process described herein. A characterized cell library entry specifies a physical layout (two-dimensional shape, size, location and orientation) of various elements corresponding integrated circuit design, as well as the geometry of a mask layer that will be used during fabrication utilizing the sequential sidewall spacer formation process described herein. Integrated circuit designs described as library cell entries may range from individual transistors and small components formed by several transistors such as simple logic gates, to larger logic functions, memories and even very large components such as computer processors and systems.

These cell library entries are provided in a library available from various sources, such as foundries, ASIC companies, third party IP providers, and even EDA companies, and used by designers when designing larger circuits. A cell library entry typically includes such information as a graphical symbol for schematic drawings; text for a hardware description language such as Verilog; a netlist describing the devices in the integrated circuit, the interconnections among them, and input and output nodes; a layout of the circuit in one or more geometry description languages such as GDSII; an abstract of the included geometries for use by place-and-route systems, a design rule check deck; information describing how the cell library entry is formed in a semiconductor substrate including the shapes of each mask that will be used to form the circuit; and so on. Some libraries may include less information for each cell library entry, and others may include more. In some libraries the entries are provided in separate files, whereas in others they are combined into a single file, or one file containing the entries for multiple different entries. In all cases the files are either stored and distributed on a computer readable medium, or delivered electronically and stored by the user on a computer readable medium. Cell libraries often contain multiple versions of the same logic function differing in area, speed and/or power consumption, in order to allow designers or automated tools the option to trade off among these characteristics. A cell library can also be thought of as a database of cell library entries. As used herein, the term "database" does not necessarily imply any unity of structure. For example, two or more separate databases, when considered together, still constitute a "database" as that term is used herein.

Memory subsystem 1324 typically includes a number of memories including a main random access memory (RAM) 1330 in which fixed instructions are stored. File storage subsystem 1328 provides persistent storage for program and data files, and may include a hard disk drive, a floppy disk drive along with associated removable media, a CD-Rom drive, an optical drive, or removable media cartridges. The databases and modules implementing the functionality of certain embodiments may be stored by file storage subsystem 1328. The host memory 1326 contains, among other things, computer instructions which, when executed by the processor subsystem 1314, cause the computer system 1310 to operate or perform functions described herein. As used herein, processes and software that are said to run in or on "the host" or "the computer," execute on the processor subsystem 1314 in response to computer instructions and data in the host memory subsystem 1326 including any local or remote storage for such instructions and data.

Bus subsystem 1312 provides a mechanism for letting the various components and subsystems of computer system 1310 communicate with each other as intended. Although bus subsystem 1312 is shown schematically as a single bus, alternative embodiments of the bus subsystem may use multiple busses.

Computer system 1310 itself can be of varying types including a personal computer, a portable computer, a workstation, a computer terminal, a network computer, a television, a mainframe, a server farm, or any other data processing system or user device. Due to the ever changing nature of computers and networks, the description of computer system 1310 depicted in FIG. 13 is intended only as a specific example for purposes of illustrating certain embodiments of the present invention. Many other configurations of computer system 1310 are possible having more or less components than the computer system depicted in FIG. 13.

Figure 14:
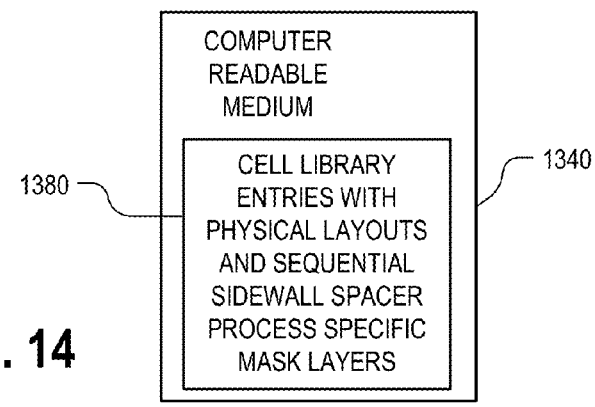
FIG. 14 shows an article of manufacture comprising a computer readable medium.

FIG. 14 shows an article of manufacture comprising a computer readable medium 1340, which can be a medium associated with file storage subsystem 1328, and/or with network interface subsystem 1318. The computer readable medium 1380 can be a hard disk, a floppy disk, a CD-ROM, an optical medium, removable media cartridge, a tape drive, flash memory or other data storage medium on which instructions executable by a computer are stored for distribution and/or safekeeping. A single computer readable medium, as the term is used herein, may also include more than one physical item, such as a plurality of CD ROMs or a plurality of segments of RAM, or a combination of several different kinds of media. As used herein, the term does not include mere time varying signals in which the information is encoded in the way the signal varies over time. The computer readable medium 1340 stores data structures and executable files 1380, including technology-specific cell library entries incorporating the specifics of the sequential sidewall spacer formation process described herein.

Figure 15A:
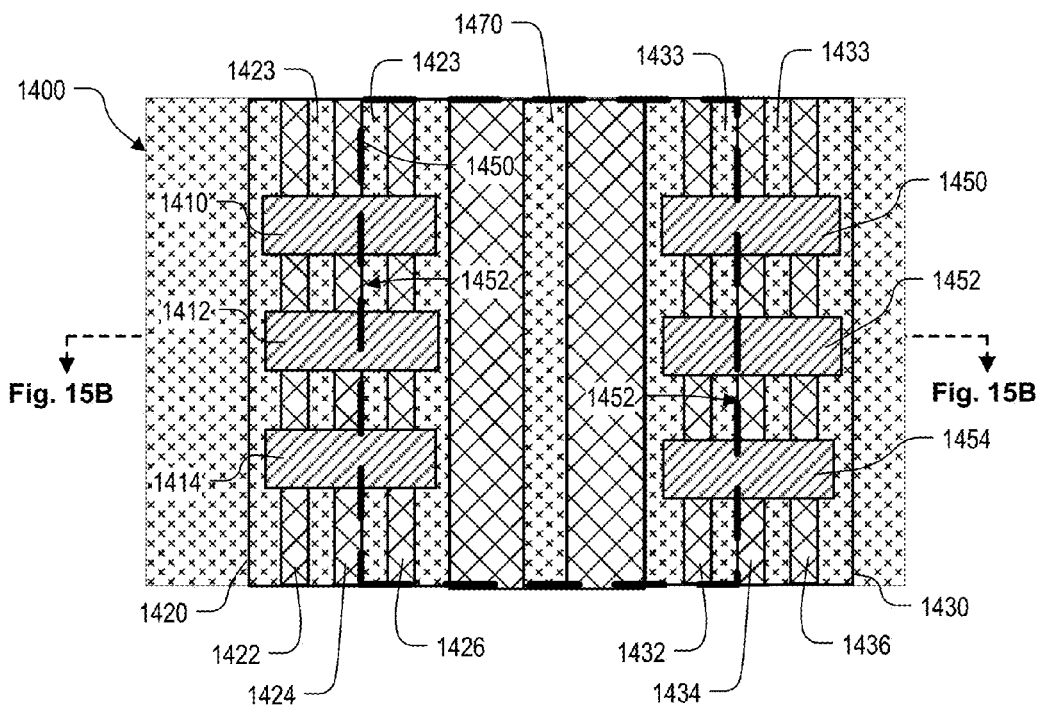
FIG. 15A shows a simplified example of an integrated circuit layout, which can constitute a simple library cell entry in the library or a part of a larger cell.
Figure 15B:
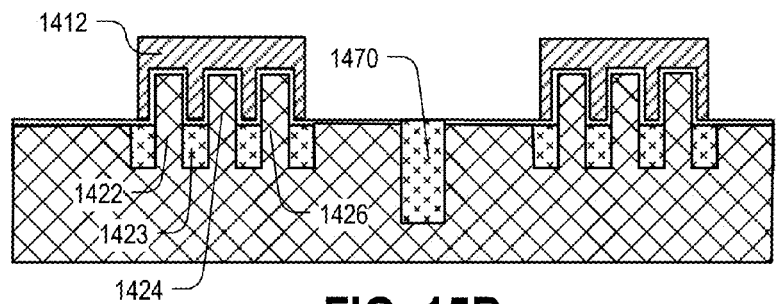
FIG. 15B shows a cross-section of the layout view illustrated in FIG. 15A

FIG. 15A shows a simplified example of an integrated circuit layout 1400, which can constitute a simple library cell entry in the library or a part of a larger cell. For illustrative purposes, FIG. 15B shows a cross-section of the layout view illustrated in FIG. 15A.

In this example, the layout 1400 is an array of FinFET transistors. It includes three gate conductor shapes 1410, 1412, 1414 extending in parallel in a first direction across a P-channel diffusion layout region 1420. Three gate conductor shapes 1450, 1452, 1454 extend across an N-channel diffusion layout region 1430. The regions 1420, 1430 are separated by a shallow trench isolation (STI) structure 1470. The P-channel diffusion layout region 1420 includes three doped semiconductor material lines (or fins) 1422, 1424, 1426 extending in parallel in a second direction perpendicular to the first direction. The lines 1422, 1424, 1426 are separated from one another by STI structures 1423 of insulator material. The N-channel diffusion layout region 1430 includes three doped semiconductor material lines (or fins) 1432, 1434, 1436 also extending in parallel in a second direction and separated from one another by STIs 1433.

P-channel FinFET transistors are located at the intersections of the gate conductor shapes 1410, 1412, 1414 and the lines 1422, 1424, 1426. Similarly, N-channel FinFET transistors are located at the intersections of the gate conductor shapes 1450, 1452, 1454 and the lines 1432, 1434, 1436.

In this example, the layout 1400 also includes a mask layer specifying an intermediate mask element 1450 having a geometry shown in the drawing. The intermediate mask element 1450 is used during a fabrication process utilizing the sequential sidewall spacer formation process described herein to form the lines 1422, 1424, 1426 and the lines 1432, 1434, 1436.

Because of the sequence of steps performed in sequential sidewall spacer formation process described herein, no mask is created that has shapes corresponding to the individual lines 1422, 1424, 1426, 1432, 1434, 1436. Instead, the single edge 1452 of the intermediate mask element 1450, corresponding to a single sidewall surface of a manufactured intermediate mask element, is used during the process described herein for fabricating the entire plurality of lines 1422, 1424, 1426. Similarly, the single edge 1452 of the intermediate mask element 1450 is used for fabricating the entire plurality of lines 1432, 1434, 1436.

The description of the physical layout and the mask is preferably in a format adept at describing graphical representations, such as Graphic Design System II (GDSII)

Figure 16:
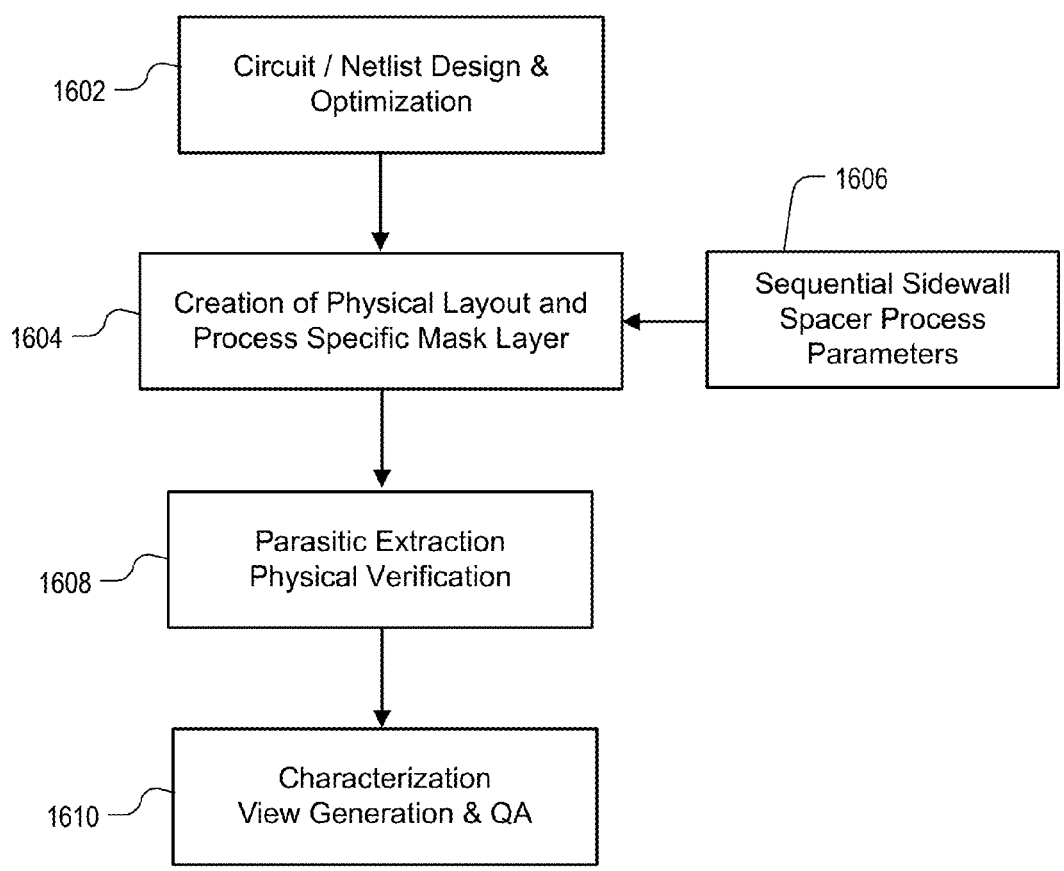
FIG. 16 is a flow chart for creating technology-specific library cell entries implementing the sequential sidewall spacer formation process described herein.

FIG. 16 is a flow chart for creating technology-specific library cell entries implementing the sequential sidewall spacer formation process described herein. The flow chart in FIG. 16 can also be utilized to create a technology-specific memory block or other type of design entry.

In step 1602, a circuit is designed for a library cell entry. Step 1602 corresponds roughly to steps 100 and steps 111-118 of FIG. 1. The circuit design in step 1602 refers to the gate or transistor level design, after compilation from a Verilog or VHDL design or similar, and before layout. The circuit design is represented after step 1602 in a netlist file.

In step 1604, the circuit design is laid out. In this process, inputs include the netlist file from step 1602, and process-specific parameters (step 1606) for use in the sequential sidewall spacer process described herein, such as may be available from the foundry to be utilized to manufacture the device. These process parameters define, among other things, process-specific design rules, and the geometry of the intermediate mask elements that will be used to form elements such as FinFet transistors, interconnect lines and other small, high-density features in the circuit design specified in the netlist. The fundamental features of the circuit design, and the shapes to be formed on each mask, are laid out and combined as appropriate according to the netlist and the process-specific parameters.

In step 1608, the circuit as laid out is analyzed for chip area used, timing verification, power dissipation, physical verification, and many other factors. If it is determined that the circuit performance is acceptable as laid out, the layout file of library cell entry is done (step 1610). Accordingly, a library cell entry is provided that specifies layout of a circuit design having been optimized using the process-specific parameters of the sequential sidewall spacer process described herein.

Figure 17:
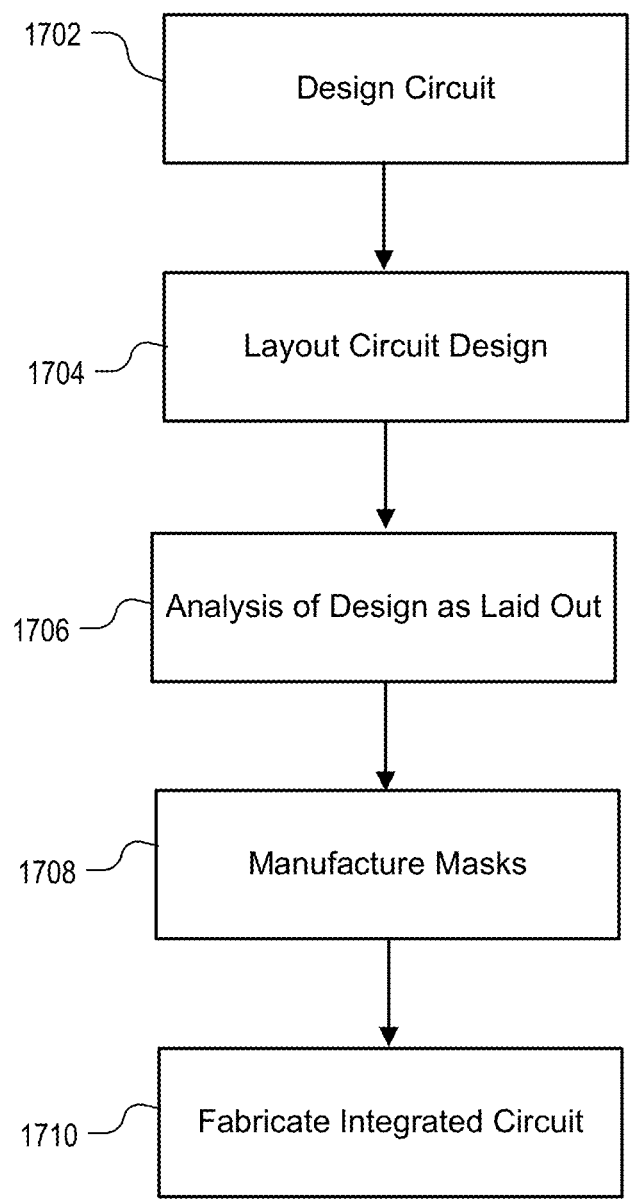
FIG. 17 is a simplified flow chart for fabricating an integrated circuit.

FIG. 17 is a simplified flow chart for fabricating an integrated circuit. In step 1702, the integrated circuit is designed. The integrated circuit design is represented after step 1702 in a netlist file.

In step 1704, the integrated circuit design is laid out. Step 1704 includes choosing the characterized cell library entries for the individual circuit devices specified in the incoming netlist. The library cells are placed into the layout and interconnected according to the circuit design. The layout is represented in a geometry file which defines, among other things, the geometry of the intermediate mask elements that will be used to perform the sequential sidewall spacer process described herein. The geometry file can have any of several standard formats, such as GDSII, OASIS, CREF, and so on, or it can have a non-standard format.

In step 1706, the layout is revised through a number of steps to better effect designer intent. The intent of the designer is discerned from the idealized layout shapes, and modifications are made to better achieve that intent in the ultimate integrated circuit. Optical proximity correction occurs in this step. The revised layout is once again represented in a geometry file, typically using one of the geometry file formats above.

In step 1708, lithographic masks are manufactured based on the modified layout from step 1706. At step 1710, integrated circuits are fabricated using the masks and performing the sequential sidewall spacer process described herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. An article of manufacture comprising:
a machine readable data storage medium storing in a non-transitory manner a plurality of software code portions defining logic for selecting a design entry for an integrated circuit from a library including a plurality of design entries, entries in the library including specifications of particular cells in a computer readable description language, at least one entry in the library comprising:
a specification for a mask element having a single edge for fabricating an entire plurality of lines of a second material to be grown epitaxially on a first material layer within trenches at locations defined by successive formation against the single edge of first sidewall spacers alternating with second sidewall spacers and removal of the first sidewall spacers; and
a specification for a layout comprising the plurality of lines of the second material.

2. The article of manufacture of claim 1, wherein the second material and the first material layer are the same material.

3. The article of manufacture of claim 1, wherein the layout further comprises a transistor formed in a particular one of the lines,
and wherein the at least one entry in the library further comprises a specification for an additional mask layer specifying an additional mask element for defining a gate conductor over the particular line.

4. The article of manufacture of claim 1, wherein the at least one entry in the library further comprises a specification for an additional mask layer specifying an additional mask element for defining gate conductors oriented orthogonally to the lines.

5. The article of manufacture of claim 1, wherein lines in the plurality of lines have substantially congruent shapes.

6. The article of manufacture of claim 1, wherein adjacent lines in the plurality of lines are separated from one another in a direction normal to the single edge of the mask element.

7. The article of manufacture of claim 1, wherein the single edge of the mask layer is aligned with an edge of a particular line in the plurality of lines.

8. The article of manufacture of claim 1, wherein the single edge of the mask layer has a contour representative of shapes of the entire plurality of lines.

9. The article of manufacture of claim 1, wherein the single edge of the mask layer has a contour representative of shapes of each of the plurality of lines.

10. The article of manufacture of claim 1, wherein lines in the plurality of lines have substantially the same width.

11. The article of manufacture of claim 1, wherein adjacent lines in the plurality of lines are separated by substantially the same separation width across the plurality of lines.

12. The article of manufacture of claim 1, wherein the lines in the plurality of lines have a width that varies across the plurality of lines by less than 10%.

13. The article of manufacture of claim 1, wherein the lines in the plurality of lines have a width less than or equal to 15 nm.

14. The article of manufacture of claim 1,
wherein the mask element further has a second single edge for fabricating an entire second plurality of lines of the second material to be grown epitaxially on the first material layer within trenches at locations defined by successive formation against the second single edge of third sidewall spacers alternating with fourth sidewall spacers and removal of the third sidewall spacers, and wherein the layout further comprises the second plurality of lines of the second material.

15. The article of manufacture of claim 14,
wherein the layout is such that:
the first plurality of lines is separated from the second plurality of lines by a minimum spacing at least twice a width of a particular line in the first plurality of lines;
each line in the first plurality of lines has a first line width roughness and a first line edge roughness less than the first line width roughness;
each line in the second plurality of lines has a second line width roughness and a second line edge roughness less than the second line width roughness; and
all the lines in the first plurality of lines have a longitudinal curvature different from each of the lines in the second plurality of lines.

\* \* \* \* \*